(12) United States Patent
Wu

(10) Patent No.: US 8,569,611 B2
(45) Date of Patent: Oct. 29, 2013

(54) BACKSHEET OF A SOLAR CELL

(75) Inventor: Kai Wu, Houli Township, Taichung County (TW)

(73) Assignee: Nexpower Technology Corp., Taichung County (TW)

( * ) Notice: Subject to any disclaimer, the term of this patent is extended or adjusted under 35 U.S.C. 154(b) by 400 days.

(21) Appl. No.: 12/768,125

(22) Filed: Apr. 27, 2010

(65) Prior Publication Data
US 2010/0288342 A1  Nov. 18, 2010

(30) Foreign Application Priority Data
May 14, 2009 (TW) ................................ 98116031 A

(51) Int. Cl.
*H01L 31/048* (2006.01)
(52) U.S. Cl.
USPC ............ 136/252; 136/259; 136/263; 428/420; 428/421; 428/458
(58) Field of Classification Search
USPC ............ 136/252, 259, 263; 428/420, 421, 458
See application file for complete search history.

(56) References Cited

U.S. PATENT DOCUMENTS

| | | | |
|---|---|---|---|
| 7,553,540 B2 * | 6/2009 | Debergalis et al. | 428/335 |
| 7,829,783 B2 * | 11/2010 | Krajewski et al. | 136/251 |
| 7,851,694 B2 * | 12/2010 | Anderson et al. | 136/251 |
| 7,943,845 B2 * | 5/2011 | Hayes | 136/251 |
| 8,080,726 B2 * | 12/2011 | Hayes | 136/251 |
| 8,481,154 B2 * | 7/2013 | Chu et al. | 428/339 |
| 2008/0156367 A1 * | 7/2008 | Uschold et al. | 136/256 |
| 2008/0185035 A1 * | 8/2008 | Hayes | 136/251 |
| 2008/0261037 A1 * | 10/2008 | Snow | 428/337 |
| 2009/0000662 A1 * | 1/2009 | Harwood et al. | 136/259 |
| 2009/0151774 A1 * | 6/2009 | Depine et al. | 136/251 |
| 2009/0255571 A1 * | 10/2009 | Xia et al. | 136/251 |
| 2010/0071756 A1 * | 3/2010 | Krajewski et al. | 136/251 |
| 2010/0108143 A1 * | 5/2010 | Hayes | 136/259 |
| 2011/0048512 A1 * | 3/2011 | Chu et al. | 136/252 |
| 2011/0083726 A1 * | 4/2011 | Takayanagi et al. | 136/251 |
| 2011/0146758 A1 * | 6/2011 | Trouilhet et al. | 136/249 |
| 2011/0244241 A1 * | 10/2011 | Ranade | 428/412 |
| 2012/0085392 A1 * | 4/2012 | Albert et al. | 136/251 |
| 2012/0167986 A1 * | 7/2012 | Meakin et al. | 136/259 |

* cited by examiner

*Primary Examiner* — Douglas McGinty
(74) *Attorney, Agent, or Firm* — Ming Chow; Sinorica, LLC

(57) ABSTRACT

The present invention discloses a backsheet of a solar cell. The backsheet of a solar cell comprises, sequentially from bottom to top, a bottom plastic layer, at least a first insulating layer, a conductive water-proof layer, at least a second insulating layer formed on the conductive water-proof layer, and a weather-resistant layer formed on the second insulating layer. The voltage-resistant ability of the weather-resistant layer is usually about one-third of that of the ordinary insulating layer and the weather-resistant layer is usually has the problem of pinhole which usually results in the defect of arc fail. Therefore, the second insulating layer, in the present invention, deposited between the conductive water-proof layer and the weather-resistant layer, can increase the voltage-resistant ability of the weather-resistant layer and to prevent the pinhole and the arc fail problem.

21 Claims, 2 Drawing Sheets

BACKSHEET OF A SOLAR CELL

BACKGROUND OF THE INVENTION

1. Field of the Invention

The present invention relates to a solar cell, more particularly relating to a backsheet of a solar cell.

2. Description of the Prior Art

The backsheet of a solar cell can protect the solar cell from water, moisture, and heat-distortion and provide the functions of insulating and bottom lining. The defects of the backsheet of the solar cell will results in a short lifetime of the solar cell. The micro-crystalline (C—Si) solar cell usually comprises the backsheet of the Tedlar/polyethylene terephthalate/Tedlar (TPT) or Tedlar/polyethylene terephthalate/ethylene-vinyl acetate (TPE) structure. The thin-film solar cell usually comprises the backsheet of Tedlar/aluminium/polyethylene terephthalate (TAP) or Tedlar/aluminium/polyethylene terephthalate/ethylene-vinyl acetate (TAPE) structure.

Please refer to FIG. 1, which represents a schematic view of a conventional backsheet of a solar cell. The backsheet 1 of a solar cell comprises, sequentially from bottom to top, a bottom plastic layer 20, a first insulating layer 22, a conductive water-proof layer 24, and a weather-resistant layer 28.

However, the voltage-resistant ability of the weather-resistant layer of the conventional backsheet is usually one-third of that of the normal insulating layer. Such configuration tends to result in the defect of arc fail if a pinhole occurred in the solar cell. The defect of pinhole can be prevented by increasing the thickness of the weather-resistant layer. However, the cost of the manufacturing of the backsheet will be therefore increased as well.

Please refer to FIG. 2, which represents a schematic view of another conventional backsheet of a solar cell. The backsheet 2 of a solar cell comprises, sequentially from bottom to top, a bottom plastic layer 20, a first insulating layer 22, a conductive water-proof layer 24, and a second insulating layer 26.

The second insulating layer 26 is known to comprise a better voltage-resistant ability and a less expense than the normal weather-resistant layer. And the defect of the arc fail can be prevented by increasing the thickness of the second insulating layer up to 50 μm (micrometer). However, the second insulating layer is not resistant to UV light and the defect of pinhole cannot be prevented if the second insulating layer is of single-layered configuration.

SUMMARY OF THE INVENTION

To solve the aforementioned shortcomings, the present invention provides a backsheet of a solar cell. The backsheet of a solar cell comprises, sequentially from bottom to top, a bottom plastic layer, at least a first insulating layer, a conductive water-proof layer, at least a second insulating layer and a weather-resistant layer.

The voltage-resistant ability of the weather-resistant layer is usually about one-third of that of the ordinary insulating layer and the weather-resistant layer is usually has the problem of pinhole. The second insulating layer, in the present invention, is therefore deposited between the conductive water-proof layer and the weather-resistant layer, so as to increase the voltage-resistant ability of the weather-resistant layer and to prevent the pinhole and the arc problem. When the second insulating layer is made from polyethylene terephthalate, the voltage-resistant ability of the weather-resistant layer is increased for 300 kV/mm. When the second insulating layer is made from ethylene-tetrafluoroethylene copolymer, the voltage-resistant ability of the weather-resistant layer is increased for 120 kV/mm.

Therefore, according to the present invention, the second insulating layer can increase the voltage-resistant ability and prevent the defect of pinhole and arc fail occurred in the conventional solar cell.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A detailed description of the present invention will be given below with reference to preferred embodiments thereof, so that a person skilled in the art can readily understand features and functions of the present invention after reviewing the contents disclosed herein.

Figure 1:
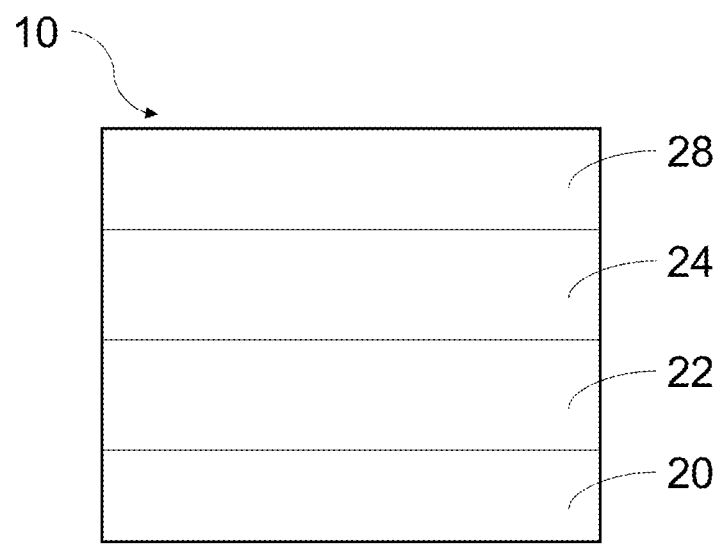
FIG. 1 represents a schematic view of a conventional backsheet of a solar cell.
Figure 2:
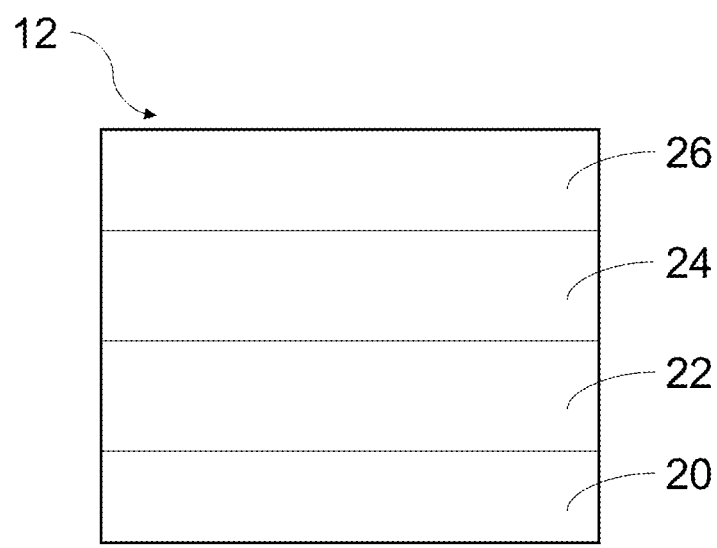
FIG. 2 represents a schematic view of another conventional backsheet of a solar cell.
Figure 3:
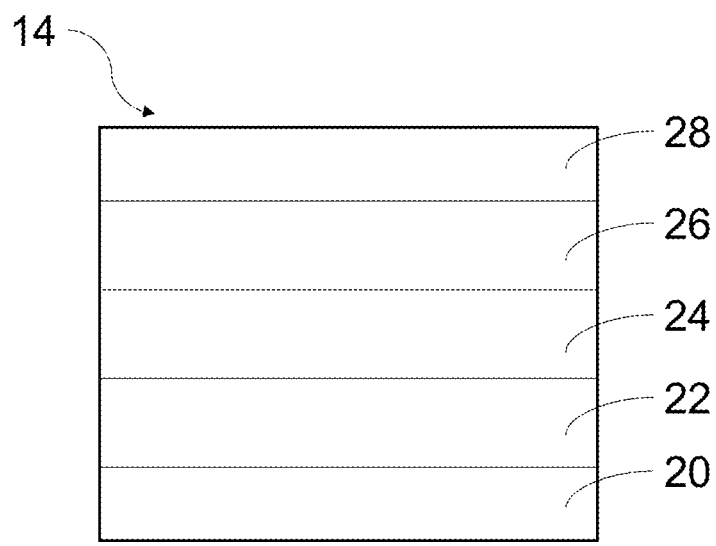
FIG. 3 represents a schematic view of a backsheet of a solar cell according to the first preferred embodiment of the present invention.

Please refer to FIG. 3, which is the schematic view of the backsheet of a solar cell according to the first preferred embodiment of the present invention. The backsheet of a solar cell 14 comprises a bottom plastic layer 20, at least a first insulating layer 22, a conductive water-proof layer 24, at least a second insulating layer 26 and a weather-resistant layer 28. In addition, the bottom plastic 20, the first insulating layer 22, the conductive water-proof layer 24, the second insulating layer 26 and the weather-resistant layer 28 are formed sequentially from bottom to top.

It is noted that the first insulating layer 22 and the second insulating layer 26 can both of a single-layer or multiple-layer conformation. For an example of illustration, the first insulating layer 22 and the second insulating layer 26 of this embodiment are nonetheless of the single-layer conformation as depicted in the FIG. 3.

The bottom plastic layer 20 can comprise a structure of ethylene-vinyl acetate (EVA), polyethylene (PE), polypropylene (PP) or a structure tending to adhere to ethylene-vinyl acetate. And the bottom plastic layer 20 comprises vinyl acetate (VA) of 2~33 percents by weight. The thickness of the bottom plastic layer 20 ranges from 0.1 to 500 μm (micrometer), and preferably ranges from 25 to 200 μm (micrometer).

The bottom plastic layer 20 can also be made from a polyethylene terephthalate (PET)-based plastic or an acrylic-based plastic. In this scenario, the thickness of the bottom plastic layer 20 ranges from 0.01 to 50 μm (micrometer), and preferably ranges from 1 to 15 μm (micrometer).

The first insulating layer 22 can be made from polyethylene terephthalate (PET), or from the material whose dielectric voltage is at least 1 kV/mm. The thickness of the first insulating layer 22 ranges from 1 to 500 μm (micrometer), and preferably ranges from 25 to 330 μm (micrometer).

The conductive water-proof layer 24 can be made from aluminium (Al), other conductive water-proof metals, or other conductive water-proof alloys, and the moisture vapour transmission rate (MVTR) of the conductive water-proof layer 24 is no larger than (i.e. equals to or be smaller than) 0.5 g/m$^2$·day and the resistivity of the conductive water-proof layer 24 is no larger than 1×10$^8$ Ω·m The thickness of the conductive water-proof layer 24 ranges from 0.1 to 200 μm (micrometer), and preferably ranges from 5 to 50 μm (micrometer).

The second insulating layer 26 can be made from polyethylene terephthalate (PET), or from the material whose dielectric voltage is at least 1 kV/mm. The thickness of the second insulating layer 26 ranges from 1 to 500 μm (micrometer), and preferably ranges from 25 to 330 μm (micrometer).

The weather-resistant layer 28 can be made from polyvinyl fluoride (PVF), ethylene-tetrafluoroethylene copolymer (ETFE), polyvinylidene fluoride (PVDF), chlorotrifluoroethylene (CTFE), polyamide (PA), polyethylene terephthalate (PET) with an anti-UV coating or additive, or other flouropolymers. The thickness of the weather-resistant layer 28 ranges from 1 to 500 μm (micrometer), and preferably ranges from 5 to 38 μm (micrometer).

The adhering of the weather-resistant layer 28 to the second insulating layer 26, the second insulating layer 26 to the conductive water-proof layer 24, the conductive water-proof layer 24 to the first insulating layer 22, and the bottom plastic layer 20 to the conductive water-proof layer 24, all can be achieved by an adhesive.

When the bottom plastic layer 20 comprises a structure of ethylene-vinyl acetate (EVA), polyethylene (PE), polypropylene (PP) or the structure tending to adhere to ethylene-vinyl acetate, the bottom plastic layer 20 can adhere to the first insulating layer 22 by an adhesive.

Figure 4:
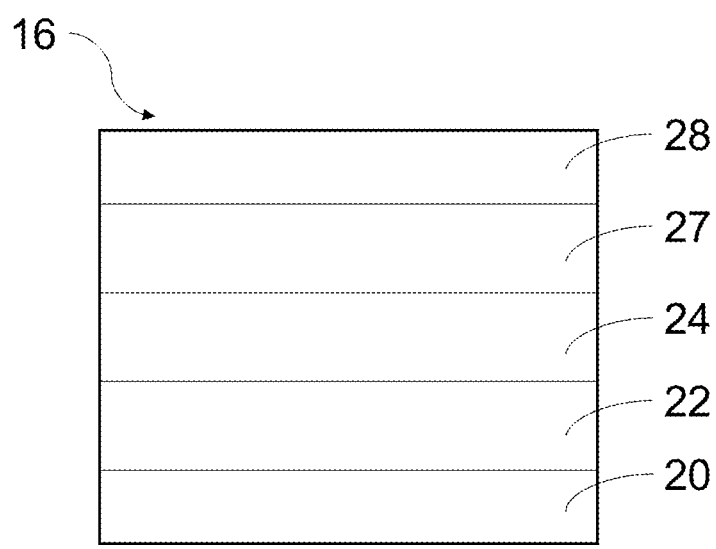
FIG. 4 represents a schematic view of another backsheet of a solar cell according to the second preferred embodiment of the present invention.

Please refer to FIG. 4, which is the schematic view of the backsheet of a solar cell according to the second preferred embodiment of the present invention. The backsheet 16 of the second preferred embodiment differs from its counterpart of the first preferred embodiment in that the second insulating layer 27 of the second preferred embodiment is made from polyvinyl fluoride (PVF), ethylene-tetrafluoroethylene copolymer (ETFE), polyvinylidene fluoride (PVDF), chlorotrifluoroethylene (CTFE), polyamide (PA), or other flouropolymer, whereas the second insulating layer 26 of the first embodiment is made from polyethylene terephthalate (PET) or from the material whose dielectric voltage is at least 1 kV/mm. Other characteristics of the elements of the second preferred embodiment are substantially the same as those of the first embodiment. The thickness of the second insulating layer 27 ranges from 1 to 500 μm (micrometer), and preferably ranges from 25 to 330 μm (micrometer).

The voltage-resistant ability of the weather-resistant layer is usually about one-third of that of the ordinary insulating layer and the weather-resistant layer is usually has the problem of pinhole. The second insulating layer, in the present invention, is therefore deposited between the conductive water-proof layer and the weather-resistant layer, so as to increase the voltage-resistant ability of the weather-resistant layer and to prevent the pinhole and the arc fail problem. When the second insulating layer is made from polyethylene terephthalate, the voltage-resistant ability of the weather-resistant layer is increased for 300 kV/mm. When the second insulating layer is made from ethylene-tetrafluoroethylene copolymer, the voltage-resistant ability of the weather-resistant layer is increased for 120 kV/mm.

The present invention can also be implemented by or applied in other embodiments, where changes and modifications can be made to the disclosed details from a viewpoint different from that adopted in this specification without departing from the spirit of the present invention.

What is claimed is:

1. A backsheet of a solar cell for protecting the solar cell, wherein the backsheet comprising:
    a bottom plastic layer;
    at least a first insulating layer formed on the bottom plastic layer;
    a conductive water-proof layer formed on the first insulating layer;
    at least a second insulating layer formed on the conductive water-proof layer, wherein the dielectric voltage of the first insulating layer and the second insulating layer is at least 1 kV/min; and
    a weather-resistant layer formed on the second insulating layer, whereby the second insulating layer can increase the voltage-resistant ability of the weather-resistant layer and prevent the defect of pinhole and arc fail which is occurred in the solar cell.

2. The backsheet according to claim 1, wherein the bottom plastic layer has a structure of ethylene-vinyl acetate or a structure tending to adhere to ethylene-vinyl acetate.

3. The backsheet according to claim 1, wherein the bottom plastic layer has a structure of polyethylene or polypropylene.

4. The backsheet according to claim 2, wherein the bottom plastic layer comprises vinyl acetate of 2~33 percent by weight.

5. The backsheet according to claim 2, wherein the bottom plastic layer comprises a thickness ranging from 0.1 to 500 μm (micrometer), and preferably ranging from 25 to 200 μm (micrometer).

6. The backsheet according to claim 1, wherein the bottom plastic layer comprises a plastic material which is selected from the group consisting of polyethylene terephthalate (PET)-based plastic and acrylic-based plastic.

7. The backsheet according to claim 6, wherein the bottom plastic layer comprises a thickness ranging from 0.01 to 50 μm (micrometer), and preferably ranging from 1 to 15 μm (micrometer).

8. The backsheet according to claim 1, wherein the first insulating layer comprises polyethylene terephthalate (PET).

9. The backsheet according to claim 1, wherein the weather-resistant layer comprises a fluoropolymer.

10. The backsheet according to claim 8, wherein the first insulating layer comprises a thickness ranging from 1 to 500 μm (micrometer), and preferably ranging from 25 to 330 μm (micrometer).

11. The backsheet according to claim 1, wherein the conductive water-proof layer comprises a water-proof conductive metal or a water-proof alloy.

12. The backsheet according to claim 11, wherein the conductive water-proof layer moisture vapor transmission rate (MVTR) is no larger than 0.5 g/m$^2$·day and resistivity is no larger than 1×10$^8$ Ω·m.

13. The backsheet according to claim 11, wherein the conductive water-proof layer comprises aluminum.

14. The backsheet according to claim 11, wherein the conductive water-proof layer comprises a thickness ranging from 0.1 to 200 μm (micrometer) and preferably ranging from 5 to 50 μm (micrometer).

15. The backsheet according to claim 1, wherein the second insulating layer comprises polyethylene terephthalate (PET).

16. The backsheet according to claim 9, wherein the fluoropolymer is selected from the group consisting of polyvinyl fluoride (PVF), ethylene-tetrafluoroethylene (ETFE) copolymer, polyvinylidene fluoride (PVDF), and chlorotrifluoroethylene (CTFE).

17. The backsheet according to claim 15, wherein the second insulating layer comprises a thickness ranging from 1 to 500 µm (micrometer), and preferably ranging from 25 to 330 µm (micrometer).

18. The backsheet according to claim 1, wherein the second insulating layer comprises fluoropolymer.

19. The backsheet according to claim 1, wherein the fluoropolymer is selected from the group consisting of polyvinyl fluoride (PVF), ethylene-tetrafluoroethylene (ETFE) copolymer, polyvinylidene fluoride (PVDF), and chlorotrifluoroethylene (CTFE).

20. The backsheet according to claim 18, wherein the second insulating layer comprises a thickness ranging from 1 to 500 µm (micrometer), and preferably ranging from 25 to 330 µm (micrometer).

21. The backsheet according to claim 9, wherein the weather-resistant layer comprises a thickness ranging from 1 to 500 µm (micrometer), and preferably ranging from 5 to 38 µm (micrometer).

\* \* \* \* \*